United States Patent [19]
Lee et al.

[11] Patent Number: 6,066,879
[45] Date of Patent: May 23, 2000

[54] COMBINED NMOS AND SCR ESD PROTECTION DEVICE

[75] Inventors: Jian-Hsing Lee; Kuo-Chio Liu, both of Hsin-Chu, Taiwan

[73] Assignee: Taiwan Semiconductor Manufacturing Company, Ltd., Hsin-Chu, Taiwan

[21] Appl. No.: 09/304,304

[22] Filed: May 3, 1999

[51] Int. Cl.[7] .................................................. H01L 23/62
[52] U.S. Cl. ......................... 257/355; 257/361; 257/362
[58] Field of Search .................................. 257/355, 361, 257/362, 363, 357; 361/91, 56, 58

[56] References Cited

U.S. PATENT DOCUMENTS

| | | | |
|---|---|---|---|
| 5,400,202 | 3/1995 | Metz et al. .................................. | 361/56 |
| 5,465,189 | 11/1995 | Polgreen et al. .......................... | 361/58 |
| 5,576,557 | 11/1996 | Ker et al. .................................. | 257/173 |
| 5,745,323 | 4/1998 | English et al. ............................. | 361/56 |
| 5,754,380 | 5/1998 | Ker et al. .................................. | 361/56 |
| 5,754,381 | 5/1998 | Ker ........................................... | 361/56 |
| 5,869,873 | 2/1999 | Yu ............................................. | 257/362 |
| 5,898,205 | 4/1999 | Lee ........................................... | 257/355 |

OTHER PUBLICATIONS

Duvvury et al., "Device Integration for ESD Robustness of High Voltage Power MOSFETs", IEEE (1994), pp. 407–410.

*Primary Examiner*—Donald L. Monin, Jr.
*Attorney, Agent, or Firm*—George O. Saile; Stephen B. Ackerman

[57] ABSTRACT

A device layout is disclosed for an ESD device for protecting NMOS or Drain-Extended (DENMOS) high power transistors where the protection device (an SCR) and the NMOS or DENMOS transistors are integrated saving on silicon real estate. The integration is made possible by adding a p[+] diffusion to the n-well (drain) of a high power NMOS (DENMOS) transistor such that the added p[+] diffusion together with the aforementioned n-well and the p-substrate of the silicon wafer create one of the two transistors of the SCR. A low triggering voltage of the SCR is achieved by having the second parasitic npn transistor of the SCR in parallel with the NMOS (DENMOS) transistor by sharing the n-well (collector/drain), p-substrate (base/channel region), and an adjacent n[+] diffusion (emitter/source) in the p-substrate. A high HBM ESD Passing Voltage is obtained by utilizing the tank oxide method of a DENMOS transistor.

14 Claims, 4 Drawing Sheets

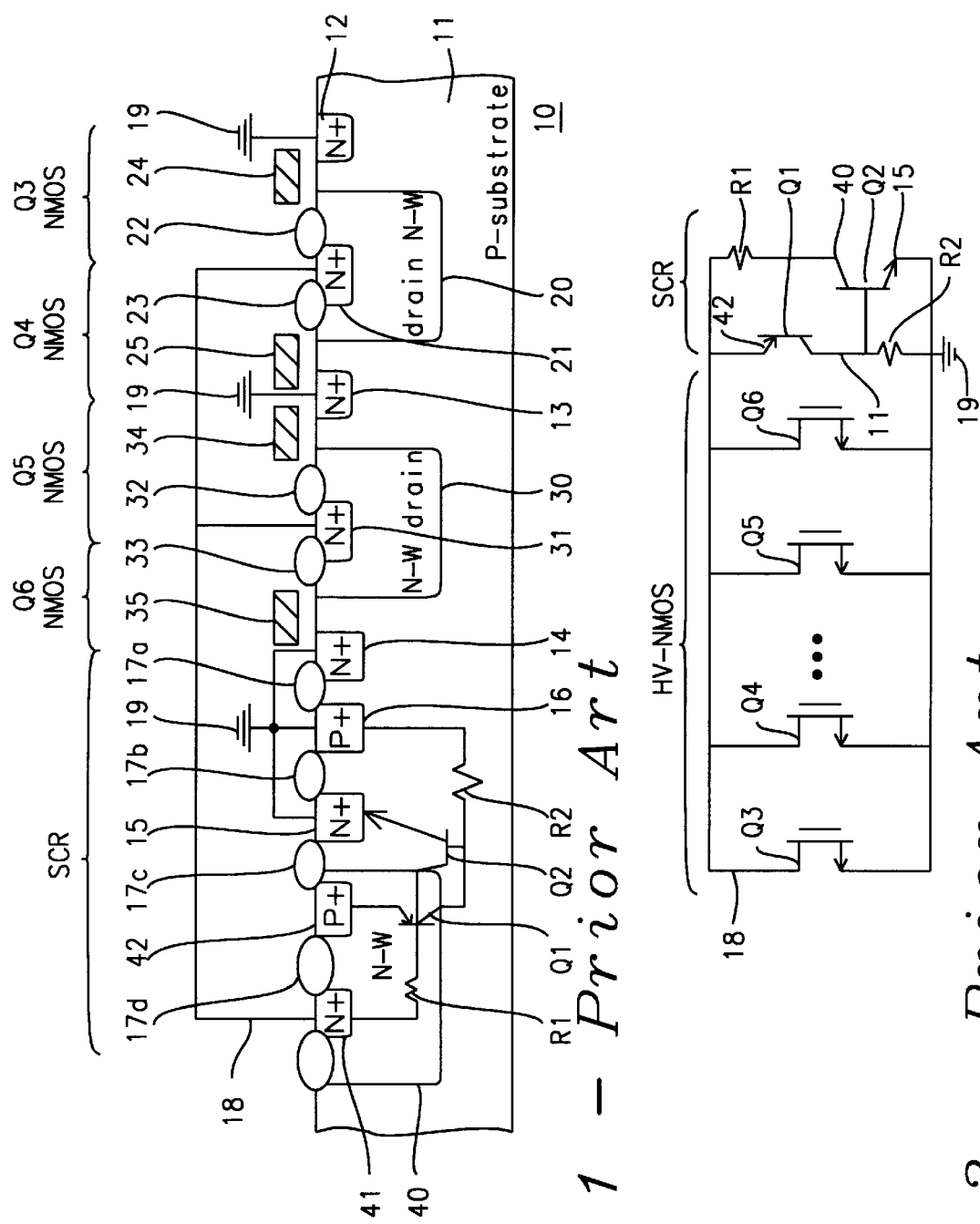
FIG. 1 – Prior Art
FIG. 2 – Prior Art

COMBINED NMOS AND SCR ESD PROTECTION DEVICE

BACKGROUND OF THE INVENTION

1. Field of the Invention

The invention relates to the protection of integrated circuits from electrostatic discharge (ESD), and more particularly to the protection of high voltage NMOS or Drain-Extended NMOS (DENMOS) transistors by a parasitic silicon controlled rectifier (SCR) which triggers at a very low voltage.

2. Description of the Related Art

The protection of integrated circuits from electrostatic discharge (ESD) is a subject which has received a lot of attention from circuit designers because of the serious damage that ESD can wreak as device dimensions are reduced. Workers in the field and inventors have proposed many solutions, many trying to solve the problem of protecting sub-micron devices while still allowing them to function unencumbered and without undue, or zero, increase of silicon real estate. The main thrust of ESD protection for MOS devices is focused on the use of parasitic npn and pnp bipolar transistors, which together form a silicon controlled rectifier (SCR). Unwanted as this SCR normally is, it can safely discharge dangerous ESD voltages as long as its trigger voltage is low enough to protect those MOS devices of which it is a part. The related art as it applies to power output transistors, with particular emphasis on Drain-Extended NMOS (DENMOS) devices for output buffer designs is discussed in a paper by C. Duvvury, J. Rodriguez, C. Jones, and M. Smayling, Texas Instruments Inc., Device Integration for ESD Robustness of High Voltage Power MOSFETs, IEDM 94–407 to 410.

FIG. 1 is a cross-sectional schematic of that paper's high voltage protection device layout and FIG. 2 is the equivalent circuit. FIG. 1 shows a semiconductor wafer 10 with a p-substrate 11 having three n-wells 20, 30, and 40, where n-wells 20 and 30 are NMOS drains. Implanted in the p-substrate are n$^+$ diffusions 12, 13, 14, 15 and p$^+$ diffusion 16 (all connected to a reference potential 19, typically ground). n$^+$ diffusion 21 and 31 are implanted into n-wells 20 and 30, respectively. n$^+$ diffusion 41 and p$^+$ diffusion 42 are implanted in n-well 40. Diffusions 21, 31, 41, and 42 are all connected to a voltage supply 18. Tank oxides 22 and 23 straddle n$^+$ diffusion 21 to either side; similarly, tank oxides 32 and 33 straddle n$^+$ diffusion 31 to either side. Diffusions 14, 16, 15, 42, and 41 are separated by field oxide regions 17a–d. NMOS (DENMOS) transistor Q3 is formed by items 20, 21, 22, gate 24 and n$^+$ diffusion 12. NMOS (DENMOS) transistor Q4 is formed by items 20, 21, 23, gate 25 and n$^+$ diffusion 13. NMOS (DENMOS) transistor Q5 is formed by items 30, 31, 32, gate 34 and n$^+$ diffusion 13. NMOS (DENMOS) transistor Q6 is formed by items 30, 31, 33, gate 35 and n$^+$ diffusion 14. The SCR consists of parasitic bipolar pnp transistor Q1 and parasitic bipolar npn transistor Q2 which are formed by p-substrate 11, n-well 40 and diffusions 41, 42 and 15. Resistors R1 and R2 are equivalent resistors for the intrinsic resistance of the n-well 40 and p-substrate 11 material, respectively.

FIG. 2, the equivalent circuit of FIG. 1, shows the typical parasitic SCR comprised of Q1, Q2, R1 and R2. Connected in parallel between voltage supply 18 and reference potential 19 are shown the NMOS (or DENMOS) transistors Q3 to Q6 which are protected by the action of the SCR. The number of NMOS (or DENMOS transistors is not limited to the four shown but depends on the current capacity desired and may be more or less than four.

The problem of the just described device layout is that the SCR is separately implemented by n$^+$ diffusion 15 and n-well 40, with contacts 41 and 42, as already described. This separate implementation uses up valuable silicon real estate which could otherwise be utilized.

Other related art is described in the following U.S. Patents which propose low voltage lateral SCRs (LVTSCR), modified lateral SCRs (MLSCR), PMOS-trigger lateral SCRs (PTLSCR), NMOS-trigger lateral SCRs (NTLSCR), and modified PTLSCRs and NTLSCRs to control electrostatic discharge:

U.S. Pat. No. 5,745,323 (English et al.) shows several embodiments for protecting semiconductor switching devices by providing a PMOS transistor which turns on when an electrostatic discharge occurs at the output of the circuit.

U.S. Pat. No. 5,754,381 (Ker) provides a modified PTLSCR and NTLSCR, and bypass diodes for protection of the supply voltage and output pad of an output buffer. The trigger voltage is the low snap-back trigger voltage of a short-channel PMOS (NMOS) device.

U.S. Pat. No. 5,754,380 (Ker et al.) is similar to U.S. Pat. No. 5,754,381 above but without bypass diodes. The invention requires a smaller layout area than conventional CMOS output buffers with ESD protection.

U.S. Pat. No. 5,576,557 (Ker et al.) provides ESD protection for sub-micron CMOS devices supplying discharge paths at $V_{dd}$ and $V_{ss}$ using two LVTSCRs. In addition a PMOS device is used in conjunction with one LVTSCR and an NMOS device with the other LVTSCR. Inclusion of the PMOS and NMOS devices allows lowering of the trigger voltage to 11–13 Volt.

It should be noted that none of the above-cited examples of the related art provide a combination of low snap-back voltage of less than 2 Volt, high Human Body Model (HBM) ESD Passing Voltage exceeding 8 kVolt and use of an SCR as a protection device without increasing the required real estate area.

SUMMARY OF THE INVENTION

It is an object of the present invention to provide an ESD device for protecting NMOS or DENMOS high power transistors where the SCR protection device and the NMOS or DENMOS transistors are integrated.

Another object of the present invention is to reduce the size of the silicon real estate for the combination of NMOS (or DENMOS) and SCR.

A further object of the present invention is to provide increased protection from ESD through a low snapback voltage of less than 2 Volt.

A yet further object of the present invention is to provide HBM ESD Passing Voltage in excess of 8,000 Volt.

These objects have been achieved by adding a p$^+$ diffusion to the n-well (drain) of a high power NMOS (DENMOS) transistor such that the added p$^+$ diffusion together with the aforementioned n-well and the p-substrate of the silicon wafer create one of the two transistors of the SCR. The low triggering voltage of the SCR is achieved by having the second parasitic npn transistor of the SCR in parallel with one of the NMOS (DENMOS) transistors by sharing the n-well (collector/drain), p-substrate (base/channel region), and an adjacent n$^+$ diffusion (emitter/source) in the p-substrate. The high HBM ESD Passing Voltage is made possible by inserting a tank oxide between the gate and the n-well drain and straddling the n-well (drain) and its n$^+$ diffusion of the NMOS (DENMOS) transistor.

BRIEF DESCRIPTION OF THE DRAWINGS

FIG. 1 is a cross-sectional view of robust NMOS transistors merged with an SCR of the prior art.

FIG. 2 is an equivalent circuit diagram of FIG. 1.

DESCRIPTION OF THE PREFERRED EMBODIMENT

We now describe the preferred embodiment of an integrated circuit and a method of fabrication of an electrostatic discharge (ESD) device which is part of high voltage NMOS or Drain-Extended NMOS (DENMOS) transistors and where the ESD device, in the form of a parasitic SCR, is integrated with these NMOS (or DENMOS) transistors.

Figures 3, 4:
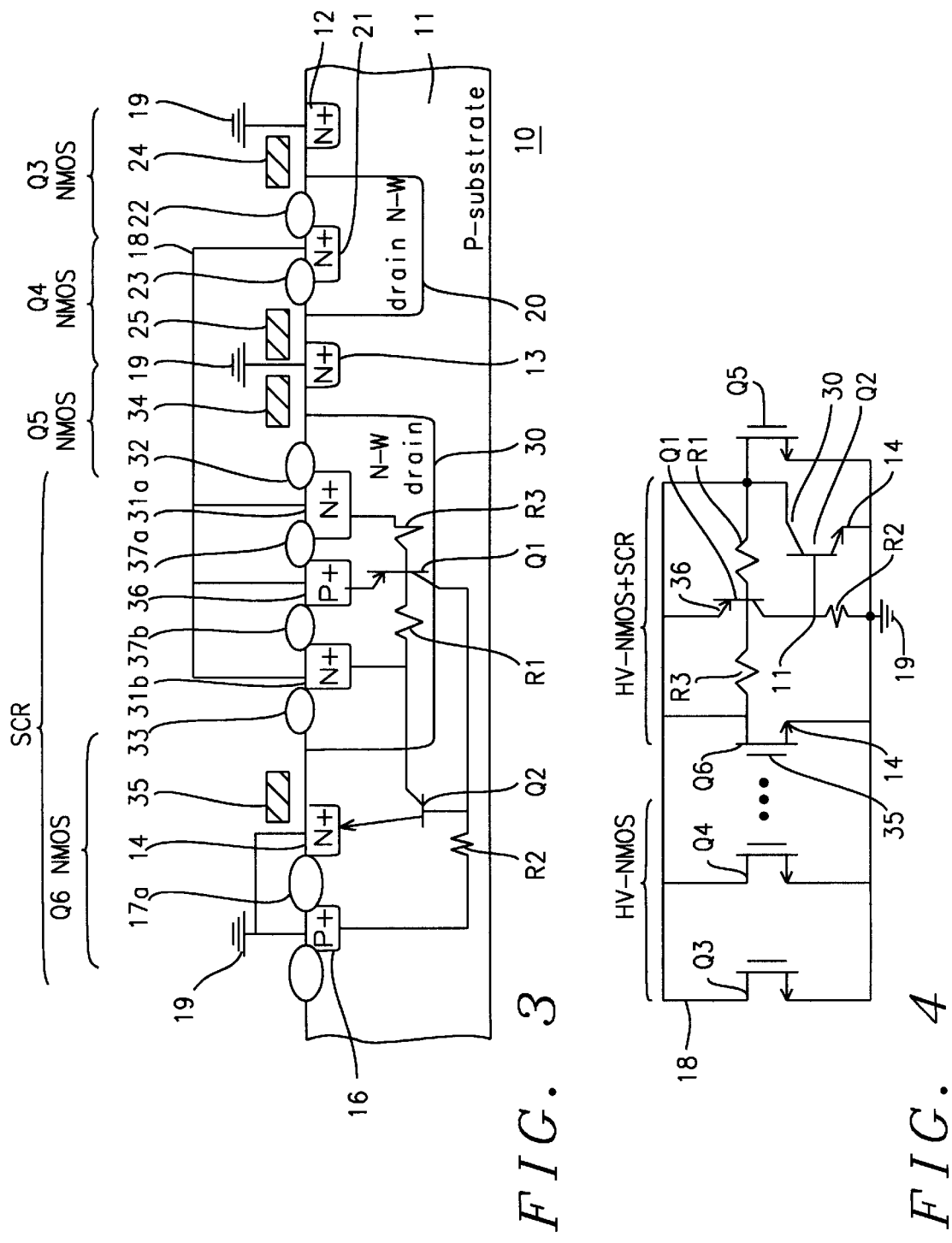
FIG. 3 is a cross-sectional view of robust NMOS transistors with a parasitic SCR of the preferred embodiment of the present invention.
FIG. 4 is an equivalent circuit diagram of FIG. 3.

Referring now to FIG. 3, we show the preferred embodiment of the present invention. FIG. 3 is a cross-sectional view of robust n-channel metal oxide semiconductor (NMOS) or Drain-Extended NMOS (DENMOS) transistors with a parasitic silicon controlled rectifier (SCR), where the SCR is created by adding a p$^+$ diffusion 36 into the NMOS drain side 30. An NMOS transistor across the SCR helps reduce the snapback voltage. Similar to FIG. 1, the number of NMOS (or DENMOS) transistors is not limited to the NMOS (or DENMOS) transistors shown (Q3–6), because the number of NMOS transistors depends on the current capacity desired and may, therefore, be more or less than the four shown.

In FIG. 3, the ESD protection and the high voltage NMOS transistors comprise a semiconductor wafer 10 with a p-substrate 11 and with two n-wells (N-W drain) 20 and 30 formed in the p-substrate. The first n-well 30 has implanted a first n$^+$ diffusion 31a, a second n$^+$ diffusion 31b, and a p$^+$ diffusion 36. The first p$^+$ diffusion 36 is located between the first (31a) and the second (31b) n$^+$ diffusion and separated from them by field oxide regions 37a and 37b. A third n$^+$ diffusion 14 and a second p$^+$ diffusion 16 are implanted in the p-substrate and separated from each other by a field oxide region 17a. A tank oxide 32 straddles first n$^+$ diffusion 31a and first n-well drain 30, and tank oxide 33 straddles in a similar manner second n$^+$ diffusion 31b and first n-well drain 30. The third n$^+$ diffusion 14 is separated from n-well 30 by a first gate 35. First and second n$^+$ diffusions 31a and 31b, and first p$^+$ diffusion 36 are connected to a voltage supply 18. Third n$^+$ diffusion 14 and second p$^+$ diffusion 16 are connected to a reference potential 19. The first gate 35, first n-well 30, and third n$^+$ diffusion 14 are the gate, source, and drain of a first NMOS transistor Q6. Together with tank oxide 33, mentioned above, first NMOS transistor Q6 becomes a DENMOS transistor. First transistor Q6 paralleled with the SCR helps reduce the snapback voltage. The snapback breakdown effect during ESD on the drain of first transistor Q6 triggers the SCR into conduction and lowers the trigger voltage for the SCR to about 1.4 Volt.

In FIG. 4 three more NMOS (or DENMOS) transistors Q3, Q4, and Q5 are shown paralleled between voltage supply 18 and reference potential 19, i.e., parallel to first transistor Q6. These three transistor provide high power performance and are shown for illustrative purposes; it is obvious to those skilled in the art that the number of transistors may vary depending on the current requirements of the circuit. Referring again to FIG. 3 we describe an embodiment of Q5. The source, gate, and drain of Q5 are formed by a n$^+$ diffusion 13 (tied to reference potential 19), a gate 34, and first n-well 30, where n-well 30 is separated from the n$^+$ diffusion 13 by gate 34. Tank oxide 32, part of transistor Q5, provides the high voltage capability. The device structure of transistors Q3 and Q4 is identical to that of transistors Q3 and Q4 described earlier in FIG. 1. The same numerals in FIGS. 1 and 3 designate the same component.

The function of first transistor Q6 differs from transistors Q3–5 because Q6 is the only transistor physically paralleled with parasitic transistor Q2. Source of Q6 and emitter of Q2 share first n$^+$ diffusion 14, and drain of Q6 and collector of Q2 share first n-well 30/second n$^+$ diffusion 31b. Therefore, when because of a ESD pulse the drain of Q6 goes into snapback breakdown, first transistor Q6 triggers transistor Q2 of the SCR into conduction and as a result lowers the trigger voltage for the SCR.

Referring now to both FIGS. 3 and 4, we describe the parasitic SCR which is created by a parasitic pnp bipolar transistor Q1 and a parasitic npn bipolar transistor Q2, where emitter, base, and collector of pnp transistor Q1 are formed by first p$^+$ diffusion 36, first n-well 30, and p-substrate 11, respectively. Emitter, base, and collector of npn transistor Q2 are formed by third n$^+$ diffusion 14, p-substrate 11, and first n-well 30, respectively. The circuit of the parasitic SCR is further comprised of three parasitic resistors R1–R3. The first parasitic resistor R1 is created by the first n-well 30, between second n$^+$ diffusion 31b and the base of pnp transistor Q1. The second parasitic resistor R2 is created by p-substrate 11, between second p$^+$ diffusion 16 and the base of npn transistor Q2. The third parasitic resistor R3 is created by first n-well 30, between first n$^+$ diffusion 31a and the base of pnp transistor Q1.

It is worth noting that the emitter of transistor Q1 of this parasitic SCR, the basis of protecting NMOS (or DENMOS) transistors Q3 to Q5 from electrostatic discharge, is created by adding p$^+$ diffusion 36 between n$^+$ diffusions 31a and 31b. The addition of this p$^+$ diffusion does not increase the area of first n-well 30 (N-W drain), although in FIG. 3 it is shown as being larger than first n-well 30 area of the prior art, see FIG. 1. The overall area actually is less for the present invention when compared to the prior art, because no separate SCR is needed.

In an ESD event the protection of the NMOS (or DENMOS) transistor (or transistors) by the SCR is achieved by the following mechanism:

as the voltage goes up, first n-well 30 (drain of Q6) breaks down and turns on npn transistor Q2;

current flows into first n-well 30 and turns on pnp transistor Q1;

the SCR fires and conducts the current of the electrostatic discharge from voltage supply 18 to reference potential 19 (typically ground).

Experiments conducted with the circuit of the invention are tabulated in Table 1. They indicate a reduction of the snapback voltage from 17 Volt for the prior art to a typical snapback voltage for the NMOS with SCR of the invention to 1.4 Volt, where the W/L ratio of 200/2 is the same. Depending on device parameter variations and other factors this voltage may range from 1 to 2 Volt. Table 1 also shows that the Human Body Model (HBM) ESD Passing Voltage increased from 2 kV for the device of the prior art to greater than 8 kV for the invention.

TABLE 1

|                          | snapback voltage | HBM ESD Passing Voltage |
|--------------------------|------------------|-------------------------|
| NMOS W/L 200/2           | 17 V             | 2 kV                    |
| NMOS W/L 200/2 + SCR W 50 | 1.4 V            | >8 kV                   |

Figure 5:
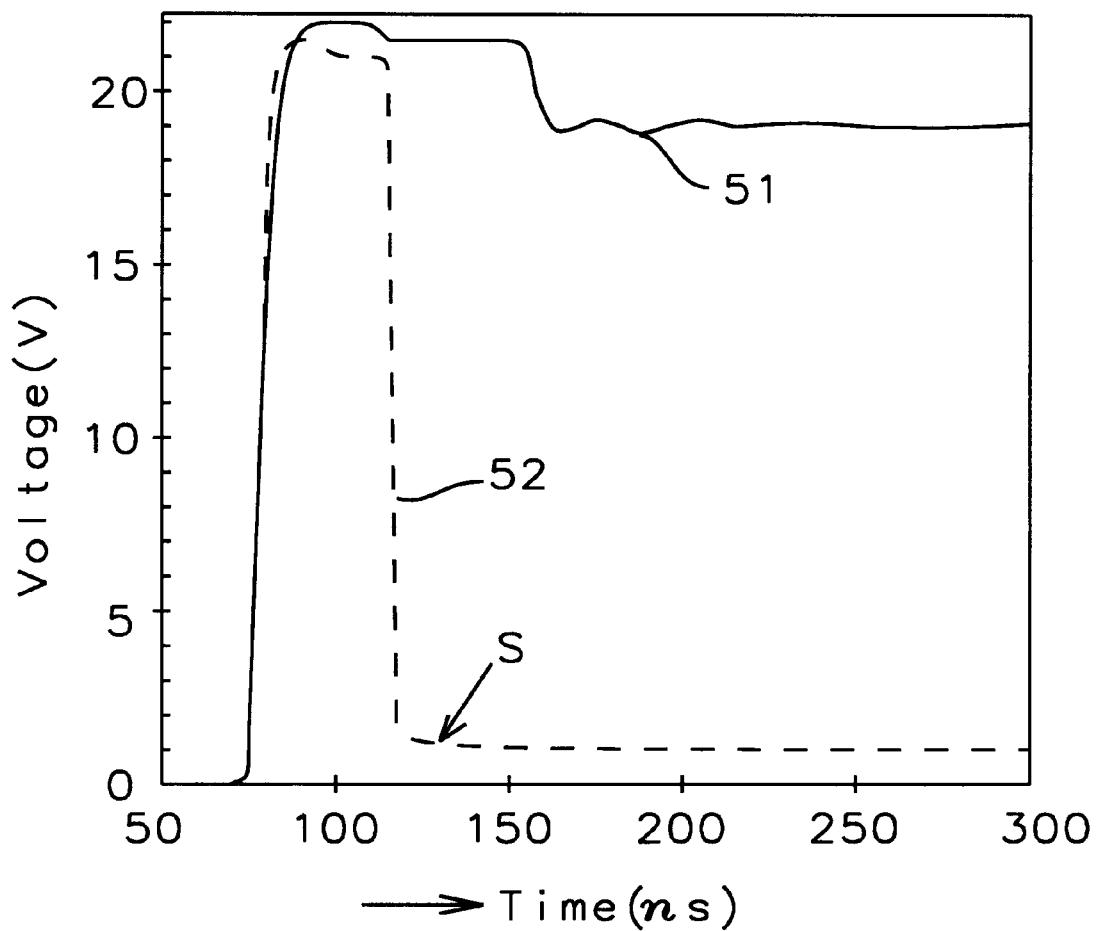
FIG. 5 is a graph of the transient voltage waveforms of the protection devices under +500 V HBM ESD zapping event for the devices of the prior art and the present invention.

FIG. 5 shows the transient voltage waveform of the SCR protection device under a +500 V HBM ESD event. Curve 51 shows the results of the circuit of the prior art indicating that the snapback voltage is in the order of approximately 19 Volt. Curve 52, the experimental result of the present invention, indicates a snapback voltage of less than 2 Volt as identified by arrow S. Not only does the pulse as produced by the invention go to a low snapback voltage, it also does it very quickly in less than 50 ns. The amount of energy that is absorb by the SCR is therefore much lower than in the prior art since the power P absorbed is:

$$P = I \cdot V_{drain}$$

where

I is the current through the SCR and $V_{drain}$ is the voltage across the SCR.

Figure 6:
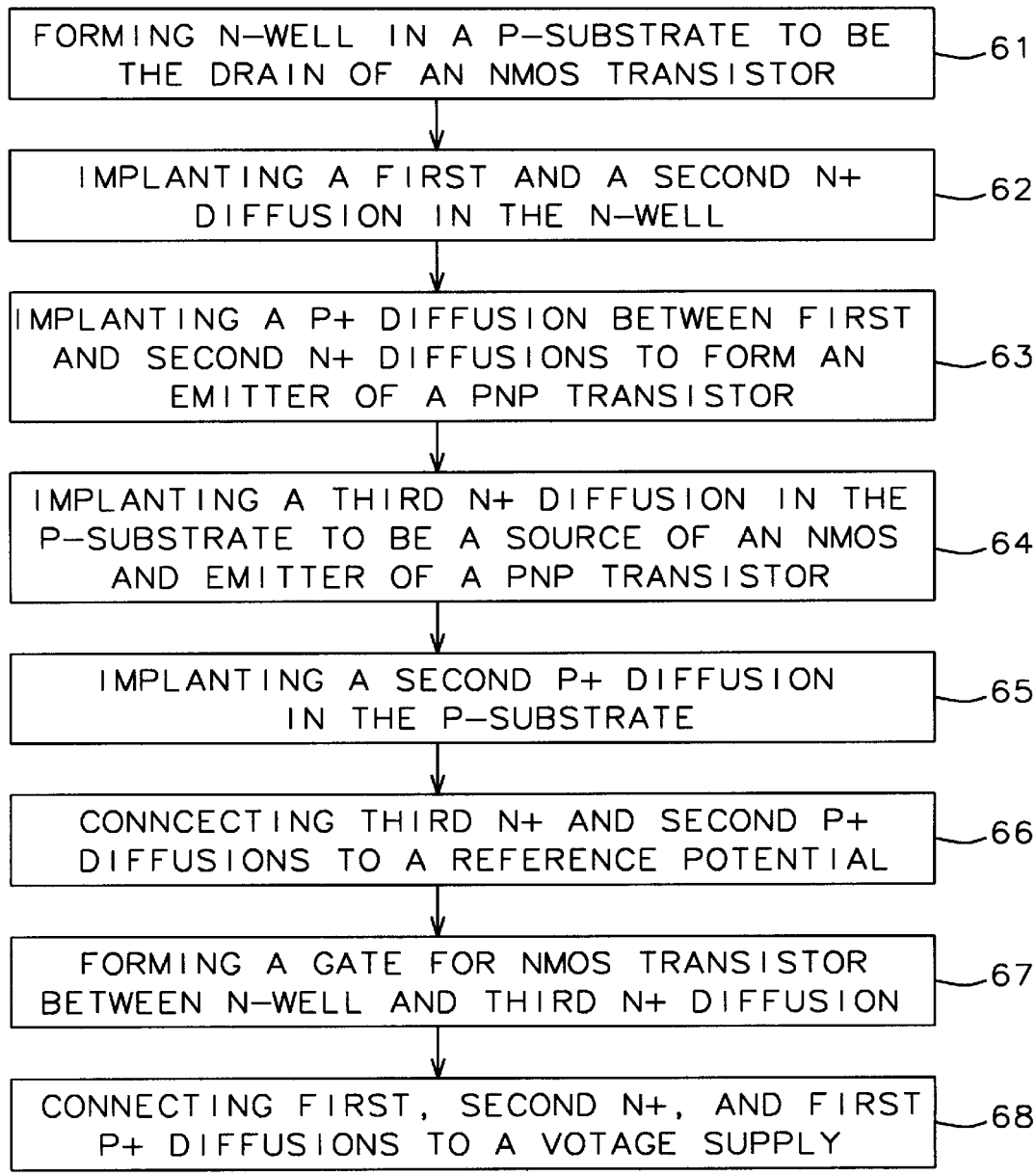
FIG. 6 is a block diagram of the method of the invention.

We now discuss the method of this invention by reference to FIG. 6. Block 61 describes forming an n-well in a p-substrate of a semiconductor wafer, where this n-well provides the drain for an NMOS (or DENMOS) transistor. First and second n$^+$ diffusion are implanted in Block 62. Block 63 shows implanting a p$^+$ diffusion between first and second n$^+$ diffusions to form an emitter of a pnp transistor. In Block 64 is shown the implanting of a third n$^+$ diffusion which is the source of an NMOS (DENMOS) transistor and the emitter of a pnp transistor. Implanting of a second p$^+$ diffusion in the p-substrate occurs in Block 65 and connecting of the third n$^+$ and second p$^+$ diffusion to a reference potential in Block 66. In Block 67 a gate is formed for the NMOS transistor between n-well and the third n$^+$ diffusion. Next, in Block 68, is connecting first, second n$^+$, and first p$^+$ diffusions to a voltage supply.

The preferred embodiment of the present invention has the advantage of utilizing less real estate by adding a p$^+$ diffusion to the n-well (drain) of the NMOS transistor and, thus, integrating one transistor of the protection device (SCR). The other advantage is that by paralleling, at the device level, an NMOS (DENMOS) and one parasitic npn bipolar transistor, the SCR triggers at below 2 Volt. Thirdly, the invention affords ESD protection in excess of 8,000 Volt.

While the invention has been particularly shown and described with reference to the preferred embodiments thereof, it will be understood by those skilled in the art that various changes in form and details may be made without departing from the spirit and scope of the invention.

What is claimed is:

1. An electrostatic discharge (ESD) protection device as part of high voltage n-channel metal oxide semiconductor (NMOS) transistors and protecting same, comprising:

a semiconductor wafer with a p-substrate;

a first n-well formed in said p-substrate;

a first and a second n$^+$ diffusion implanted in said first n-well;

a first p$^+$ diffusion implanted in said first n-well;

a third n$^+$ diffusion implanted in said p-substrate;

a second p$^+$ diffusion implanted in said p-substrate;

said first and said second n$^+$ diffusion, and said first p$^+$ diffusion connected to a voltage supply;

said third n$^+$ diffusion and said second p$^+$ diffusion connected to a reference potential;

a first gate formed between said first n-well and said third n$^+$ diffusion, said first gate, said first n-well, and said third n$^+$ diffusion representing a gate, a source, and a drain of an NMOS transistor, respectively;

a parasitic silicon controlled rectifier (SCR), further comprising:

a parasitic pnp bipolar transistor, having an emitter, a base, and a collector, said emitter, said base, and said collector of said parasitic pnp bipolar transistor formed by said first p$^+$ diffusion, said first n-well, and said p-substrate, respectively; and a parasitic npn bipolar transistor, having an emitter, a base, and a collector, said emitter, said base, and said collector of said parasitic npn bipolar transistor formed by said third n$^+$ diffusion, said p-substrate, and said first n-well, respectively.

2. The device of claim 1, wherein said first p$^+$ diffusion is located between said first and said second n$^+$ diffusion.

3. The device of claim 1, wherein said first p$^+$ diffusion, said first, and said second n$^+$ diffusion are separated by field oxide regions.

4. The device of claim 1, wherein a first parasitic resistor is created in said first n-well, said first parasitic resistor extending between said second n$^+$ diffusion and said base of said parasitic pnp transistor.

5. The device of claim 1, wherein a second parasitic resistor is created in said p-substrate, said second parasitic resistor extending between said second p$^+$ diffusion and said base of said parasitic npn transistor.

6. The device of claim 1, wherein a third parasitic resistor is created in said first n-well, said third parasitic resistor extending between said first n$^+$ diffusion and said base of said parasitic pnp transistor.

7. The device of claim 1, wherein said SCR has a snapback voltage ranging from 1 to 2 Volt.

8. The device of claim 1, wherein said NMOS transistor is further paralleled by a plurality of said NMOS transistors.

9. The device of claim 8, wherein said NMOS transistors are drain-extended NMOS (DENMOS) transistors.

10. A method of protecting a high voltage n-channel metal oxide (NMOS) semiconductor transistor from electrostatic discharge (ESD) by a parasitic silicon controlled rectifier (SCR):

providing a semiconductor wafer with a p-substrate;

forming a first n-well in said p-substrate;

implanting a first and a second n$^+$ diffusion in said first n-well;

implanting a first p$^+$ diffusion in said first n-well;

implanting a third n$^+$ diffusion in said p-substrate;

implanting a second p$^+$ diffusion in said p-substrate;

connecting said first and said second n$^+$ diffusion, and said first p$^+$ diffusion to a voltage supply;

connecting said third n$^+$ diffusion and said second p$^+$ diffusion to a reference potential;

forming a first gate between said first n-well and said third n$^+$ diffusion, said first gate, said first n-well, and said third n$^+$ diffusion representing a gate, a source, and a drain of an NMOS transistor, respectively, and;

protecting said NMOS transistor by utilizing an intrinsic parasitic SCR.

11. The method of claim 10, locating said first p⁺ diffusion between said first and said second n⁺ diffusion.

12. The method of claim 10, separating said first p⁺ diffusion, said first, and said second n⁺ diffusion by field oxide regions.

13. The method of claim 10, further paralleling said NMOS transistor by a plurality of said NMOS transistors.

14. The method of claim 13, utilizing drain-extended NMOS (DENMOS) transistors in place of said NMOS transistors.

* * * * *